US006765388B1

(12) United States Patent
Clegg

(10) Patent No.: US 6,765,388 B1
(45) Date of Patent: Jul. 20, 2004

(54) ASSESSING A PARAMETER OF CELLS IN THE BATTERIES OF UNINTERRUPTABLE POWER SUPPLIES

(75) Inventor: Andrew Simon Clegg, Gloucestershire (GB)

(73) Assignee: Elliott Industries Limited, London (GB)

( * ) Notice: Subject to any disclaimer, the term of this patent is extended or adjusted under 35 U.S.C. 154(b) by 171 days.

(21) Appl. No.: 10/049,746

(22) PCT Filed: Aug. 3, 2000

(86) PCT No.: PCT/GB00/02992
§ 371 (c)(1),
(2), (4) Date: May 1, 2002

(87) PCT Pub. No.: WO01/09631
PCT Pub. Date: Feb. 8, 2001

(30) Foreign Application Priority Data

Aug. 3, 1999 (GB) .............................. 9918304

(51) Int. Cl.[7] ............................................ G01N 27/416
(52) U.S. Cl. ........................................................ 324/426
(58) Field of Search .............................. 320/134, 136; 324/426, 427, 430

(56) References Cited

U.S. PATENT DOCUMENTS 4,697,134 A 9/1987 Burkum et al. ............... 320/48

5,457,377 A 10/1995 Jonsson ........................... 320/5
5,744,932 A 4/1998 Kissel ............................ 320/48

FOREIGN PATENT DOCUMENTS

| GB | 2 271 229 | 4/1994 |
|---|---|---|
| JP | 3249582 | 11/1991 |
| JP | 3274479 | 12/1991 |
| JP | 3282275 | 12/1991 |
| JP | 3282276 | 12/1991 |
| JP | 8179017 | 7/1996 |
| JP | 9121471 | 5/1997 |
| JP | 9121472 | 5/1997 |
| JP | 10056744 | 2/1998 |
| WO | WO 93/25917 | 12/1993 |
| WO | WO 98/53335 | 11/1998 |

Primary Examiner—Gregory J. Toatley, Jr.
(74) Attorney, Agent, or Firm—Westman, Champlin & Kelly, P.A.

(57) ABSTRACT

A method and apparatus for measuring the electrical efficacy of one or more battery cells for use in an uninterruptable power supply are disclosed. The efficacy is determined by making use of the ripple current which flows in the battery cells when in use in the uninterruptable power supply. Simultaneous measurement, for example, of the ripple current and a corresponding voltage component enables the internal impedance of a battery cell to be determined, the impedance acting as an indicator of electrical efficacy.

19 Claims, 3 Drawing Sheets

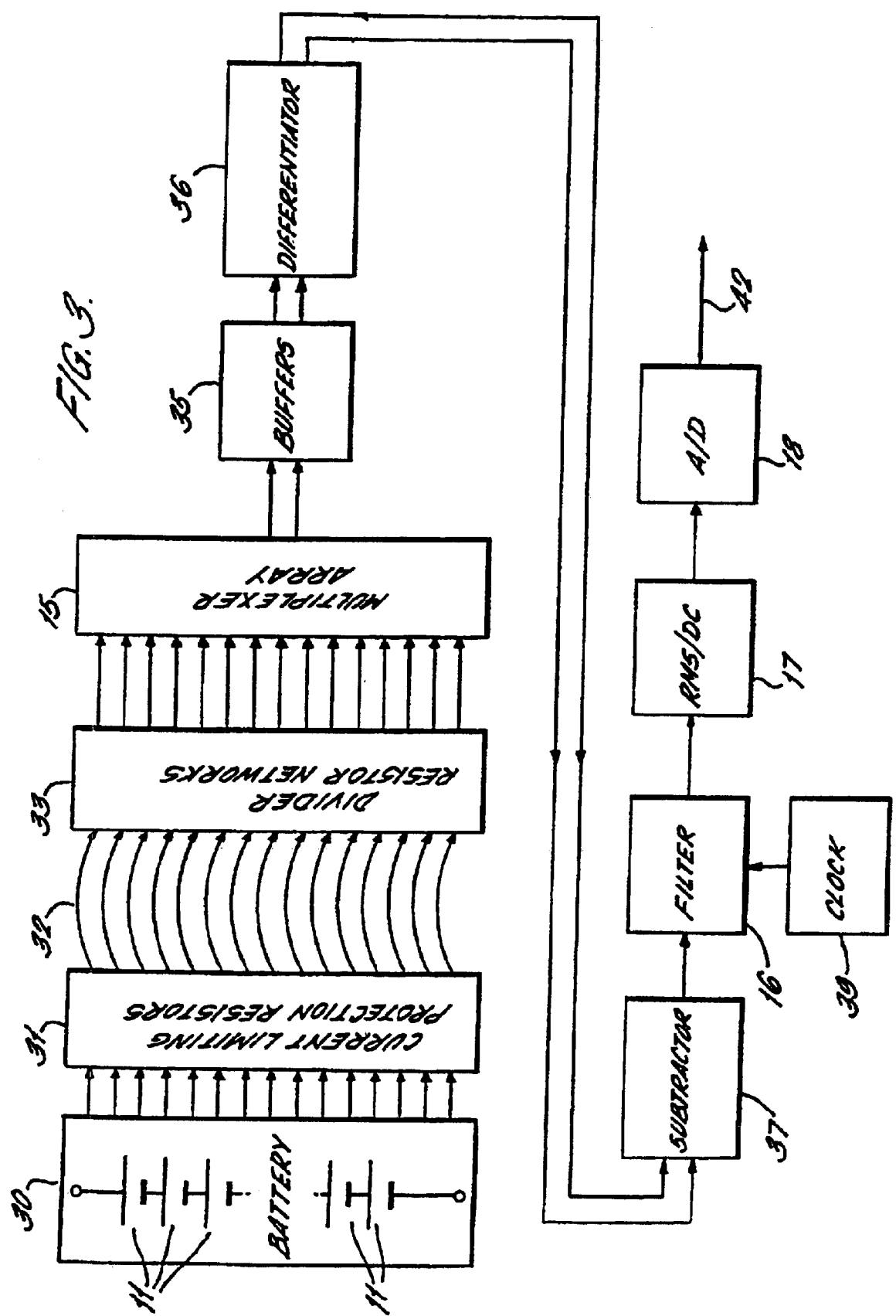

ASSESSING A PARAMETER OF CELLS IN THE BATTERIES OF UNINTERRUPTABLE POWER SUPPLIES

The present invention relates to uninterruptable power supplies and in particular to a method and apparatus for assessing a parameter of the cells in the batteries of such power supplies.

Uninterruptable power supply systems are used in situations where unexpected loss of power is particularly undesirable, for example by financial institutions, telecommunications installations, the utilities, hospitals and the military. They are needed where loss of power is unacceptable, for example where hospital patients rely on life support systems, or where data loss due to a computer shut down would be unacceptable as in a financial institution. The battery of the uninterruptable power supply is typically the last line of defence against total shutdown during power outages.

A typical arrangement of an uninterruptable power supply is shown in FIG. 1. An external alternating current (a.c.) power supply 1, generally supplied by an outside utility company, is converted to direct current (d.c.) by a rectifier 2. The rectified d.c. is converted back to a.c. by an inverter 3 for supply to the power supply user 4. A battery 5 is connected to the d.c. part of the system in such a way that the charge on the battery is maintained during normal operation of the power supply. The battery may typically comprise a large number of lead acid cells. Should the external power supply 1 fail for any reason, the battery 5 maintains the operating voltage of the d.c. part of the system so that the power supply to the user 4 is maintained.

Battery 5 is shown, for convenience, and simplicity connected between the D.C. voltage and earth. In practise, however, especially on larger batteries, the battery is generally at a voltage floating with respect to earth, as supplied by the rectifiers.

Unless the battery is healthy, it may not be able to carry the required electrical load when the a.c. supply is cut off. Thus it is desirable to be able to determine an indication of the condition of the cells in the battery, so as to be able to take further action, for example by repairing or replacing a cell, if a cell is unlikely to be able to meet the power demands whilst the a.c. supply is cut off.

Batteries are generally manufactured with a certain life span that is dependent on environmental criteria and the number of discharges supplied by the battery. Some of the discharges will be due to use of the battery during a.c. power cuts, but some may occur during load testing. One typical method of determining battery health employs a load test. During this load test, the battery is disconnected from the power supply system and discharged across a load such as a resistor bank. The rate at which the cell voltage then decays is indicative of the battery's health and ability to sustain the power supply should the a.c. supply be cut. Weak battery cells display earlier and more rapid signs of voltage decay. The voltage decay characteristic obtained during a load test correlates well with the expected performance, but the test is labour intensive and cannot easily be performed with the battery connected to the operating uninterruptable power supply. Furthermore, battery lifetime is reduced as a result of the required discharge.

To prolong battery lifetime, therefore, modes of testing that do not involve large discharges have been developed. For example, reducing the depth of discharge during battery testing greatly improves battery lifetime. An alternative to load testing is to use impedance measurements to determine battery condition.

Any device through which an electrical current will flow exhibits an impedance to that flow. In a lead acid battery the impedance comprises pure resistance components such as the battery terminals, plates, and the resistance of the electrochemical path, and capacitative components, in particular of the parallel plates. The impedance of the battery will therefore depend on the frequency at which it is measured. Detailed analysis of battery impedance measurements is difficult, requiring complex calculations. No universal equivalent circuit is available to describe the response of even a single electrode. The situation is yet more complicated when considering complete cells or batteries, with the influence on impedance of all the individual components being difficult or impossible to separate. For this reason, battery impedance measurements in practice are usually limited to one or a few impedance measurements at fixed frequencies. Deviations of a single cell from a norm may then indicate that this cell is faulty.

Although the battery resistance can be measured using a d.c discharge across two or more different loads, battery lifetime may be affected by the significant discharge required to obtain repeatable readings, and a long measurement cycle is needed to ensure that battery recovers before taking measurements from the next cell. These problems do not occur during an a.c. impedance measurement. A variety of frequencies have been suggested or used for such measurements, ranging from 10 Hz to 1 mHz. A signal generator is used to apply an a.c. signal of the required frequency to individual cells or to the whole battery. Current and voltage readings are then made to determine the impedance of individual cells.

By use of an on-line monitor it is possible to look for changing cell float voltages and cell impedance values that signal that the characteristics of the cell are changing. In such an application it does not matter that a physically correct value of impedance is not returned by the monitor. Rather, the monitor needs to determine whether a measure of the impedance of a given cell or group of cells has changed significantly over time, perhaps with respect to some baseline or norm, or whether the measure of impedance of one cell or group of cells is significantly different from the battery average. Long term stability is an important indicator of cell performance and health. The skilled and experienced person is able to make a decision to make further checks on a cell or group of cells, perform repairs or install a replacement, based on the measurements of impedance. Automatic monitoring equipment, perhaps embodied in a computer connected to a telecommunications link, may be used to assist in this process.

Impedance monitors of the prior art have measured cell impedance by injecting an a.c. signal of a given frequency into the battery and by filtering measurements of voltage and current at the same frequency. Because of the large capacity of the batteries used in uninterruptable power supplies the signal generator may need to be of a considerable size.

It is an object of the present invention to provide an improved method for determining the condition of cells within the batteries of uninterruptable power supplies.

According co the present invention, there is provided a method of measuring the electrical efficacy of one or more battery cells for use in an uninterruptable power supply, the method comprising: measuring at least one of an a.c. component of a current through the battery cell or cells and an a.c. component of a voltage across the said battery cell or cells, the a.c. component arising from a ripple current in the said battery cell or cells in use; and determining the electrical efficacy of the cell or cells on the basis of the or at least one of the measured a.c. current and voltage components.

The ripple current in the battery results from the normal operation of the uninterruptable power supply. In particular, it may result from the operation of those components converting between direct and alternating current. Electrical signals related to the ripple current include the ripple current itself and ripple voltages driving or driven by the ripple current.

Preferably, the step of determining the electrical efficacy includes obtaining a numerical value from the, or at least one of the, measured a.c. current and voltage components.

In that case, the electrical efficacy of the or each battery cell may be determined by comparison of the said numerical value with a corresponding further numerical value obtained by measurement of a.c. current and/or voltage components from one or more different cells. The electrical efficacy may in a particularly preferred embodiment be determined by comparison of the said numerical value with the average of a plurality of further numerical values obtained by measurement of a.c. current and/or voltage components from a corresponding plurality of separate arrays of single or multiple cells respectively.

Alternatively, the electrical efficacy of the battery cell or cells may be determined by comparison of the said numerical value with a corresponding predetermined numerical value.

The method may further comprise the steps of measuring both the a.c. component of current through the battery cell or cells and the a.c. component of the voltage across the battery cell or cells; and obtaining a value for the internal impedance of the battery cell or cells via a combination of the said current component and the said voltage component.

Although the impedance of the cell or cells is measured in preference, other parameters may be conveniently assessed, as will be apparent to the person skilled in the art. For example the resistive, capacitive or inductive components of the battery impedance, or the power dissipated in the cell or group of cells within a given frequency band may be determined. These and other parameters may be of use in assessing the condition of the cell or group of cells.

Preferably, the step of measuring at least one of the a.c. components of a current and a voltage includes the steps of: measuring electrical signals representative of at least one of the voltage level across the cell or cells and the current level through the cell or cells; and frequency filtering the or each measured electrical signal to extract the said a.c. component arising from the ripple current. In that case, the step of filtering includes isolating a band of frequencies from the or each said electrical signals.

The band of frequencies may include at least one harmonic frequency of the a.c. mains frequency, such as harmonics of 50 Hz or 60 Hz. Most preferably, components at 900 Hz and 1080 Hz are chosen.

The invention also extends to an apparatus for measuring the electrical efficacy of one or more battery cells for use in an uninterruptable power supply, the apparatus comprising an ammeter arranged to measure an a.c. component of a current through the battery cell or cells, the a.c. current component arising from a ripple current in the said battery cell or cells in use, the electrical efficacy of the cell or cells being determined on the basis of the measured a.c. current component.

In yet a further aspect, the invention resides in an apparatus for measuring the electrical efficacy of one or more battery cells for use in an uninterruptable power supply, the apparatus comprising a voltmeter arranged to measure an a.c. component of a voltage across the battery cell or cells, the a.c. voltage component arising from a ripple current in the said battery cell or cells in use, the electrical efficacy of the cell or cells being determined on the basis of the measured a.c. voltage component.

In that case, the apparatus may further comprise an ammeter arranged to measure an a.c. component of a current flowing through the battery cell or cells, the a.c. current component also arising from the said ripple current in the said battery cell or cells in use, the electrical efficacy of the cell or cells being determined on the basis of both the measured a.c. voltage component and the a.c. current component.

A filter such as a fifth order band pass filter may also be provided to isolate harmonic frequencies of mains frequencies, for example.

Advantageously, apparatus according to the present invention may be characterised in that it does not comprise a signal generator for injecting a current into the battery.

Embodiments of the present invention will now be described by way of example only and with reference to the drawings, of which:

FIG. 3 is a schematic diagram showing apparatus embodying the present invention, for measuring the voltage across cells or groups of cells of a battery of an uninterruptable power supply.

Alternating current methods of measuring impedance in battery cells have hitherto required the injection of an alternating current into the battery string. The method of the present invention utilises electrical signals related to the inherent ripple current present in almost all uninterruptable power supply batteries.

Ripple current is caused by the power supply utilising the power storage capacity of the battery. The battery is used to provide current for the inverter to produce an a.c. current from the d.c. bus voltage. This ripple current typically has a waveform that repeats at least at the frequency of the alternating current supplied by the inverter, but also contains many higher order harmonics and noise. The peak to peak magnitude of the ripple current is typically 20% to 100% of the actual load current supplied by the inverter. The ripple current is associated with related electrical signals, in particular, ripple voltages across various battery components.

One embodiment of the invention will now be described with reference to FIG. 2 which shows, schematically, an apparatus for measuring the impedance of cells or groups of cells in a battery for an uninterruptable power supply.

Figure 1:
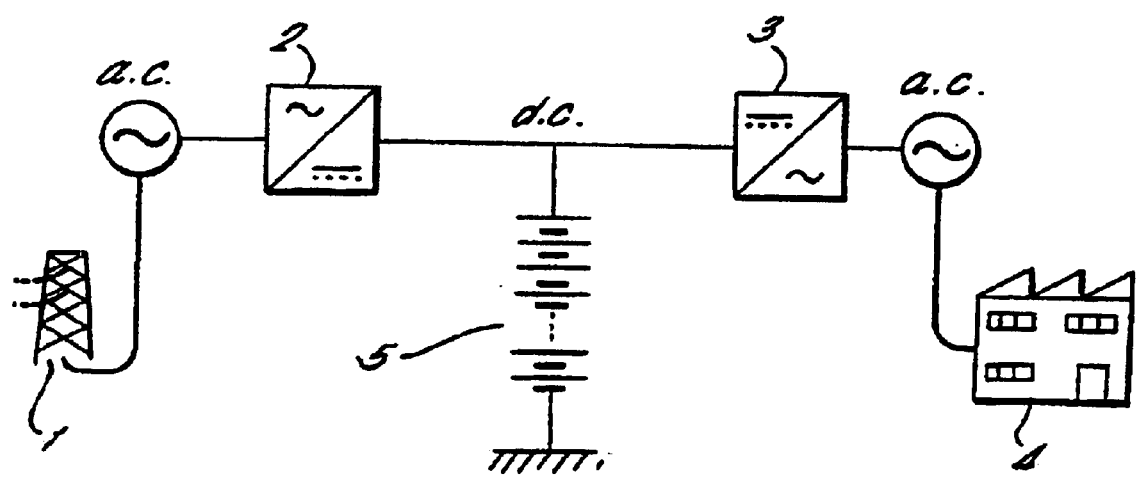
FIG. 1 shows a typical arrangement of an uninterruptable power supply.
Figure 2:
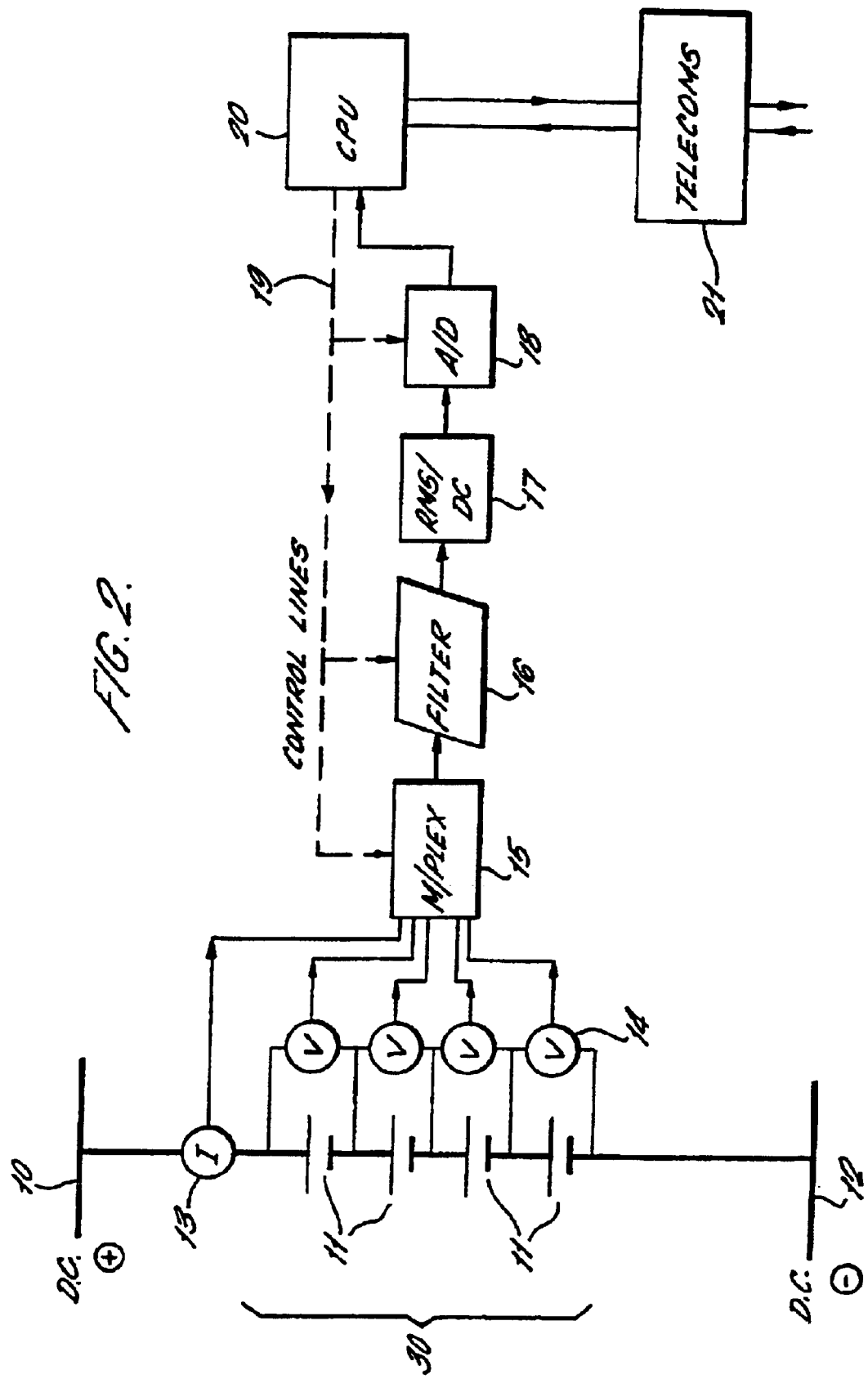
FIG. 2 is a schematic diagram showing apparatus for measuring the impedance of cells or groups of cells in a battery for an uninterruptable power supply.

As seen in FIG. 2, a number of cells 11 are together constituting a battery 30 connected in series across a d.c. bus 10, 12 of an uninterruptable power supply. The cells 11 make up the battery used to maintain the voltage of the d.c. bus during a period when the a.c. supply 1 (FIG. 1) is cut. The cells are typically supplied grouped into units which are then installed in the uninterruptable power supply. A whole unit may then be replaced if found to be faulty.

An ammeter 13 is connected in series with the cells 11 and measures the instantaneous current flowing through the battery at a selected frequency.

A voltmeter 14 is likewise connected in parallel with the cells 11 and measures the instantaneous voltages across each of the cells 11, again at the selected frequency. The apparatus may conveniently be protected by individual current limiting protection resistors and the voltages measured using a number of divider resistor networks, yielding voltage signals from the junction between each cell. These features will be described in more detail with reference to FIG. 3 below.

At any one time, the current measurement or the voltage measurement of a particular cell is selected by a multiplexer array 15, under the control of a central processing unit (CPU) 20. Typically the multiplexer array 15 may select the voltage measurement signals from both sides of a cell. As will be described in connection with FIG. 3, these signals may then be buffered before a differentiator circuit removes the d.c. components and a subtractor circuit converts the differential of the two signals to a single bipolar signal.

The current or voltage signal selected by the multiplexer array is filtered using a high order band pass filter 16 arranged to pass a narrow band of frequencies around a selected frequency. The resulting filtered signal is converted to a d.c. voltage using a root-mean-square a.c. to d.c. converter 17 and is sampled using an analogue to digital converter 18. The resulting digital data is read by the CPU 20, which is linked to each of the multiplexer array 15, band pass filter 16, a.c. to d.c. converter 17 and analogue-to-digital converter 18 by a control line 19.

The high order band pass filter may be centered on a frequency that is selected to best indicate battery condition. A frequency of 900 Hz may be chosen in the United Kingdom and Europe where the frequency of the external a.c. supply is 50 Hz. Similarly, in the United States of America a central filter frequency of 1080 Hz may be chosen for use with 60 Hz mains a.c.

Measurements of battery impedance at various other frequencies, however, have been found to yield good indications of battery condition, and any suitable frequency may be used. A clock sweepable 5th order band pass filter under the control of a programmable clock filter has been found to provide good results in the operation of the present apparatus, and allows the central frequency of the filter to be varied conveniently if required. Other filter arrangements may be equally suitable.

The CPU 20 calculates the ratios of the digitised voltage and current data to yield measurements of the impedance of the battery cells. By means of the multiplexer, the CPU 20 is able to sequentially select the voltage signal of each cell 11. The CPU may record the measurements of impedance, preferably in a non-volatile memory and/or on a mass storage device such as a magnetic device (not shown).

It is not necessary for calibrated measurements of impedance to be obtained, since the conditions of the cells of the battery can be assessed by monitoring changes in impedance over time, or by comparing the simultaneous impedances of a cell to other cells or the battery average.

By means of a telecommunications link 21, the CPU 20 may be remotely interrogated to obtain the impedance measurements. An assessment of the conditions in the battery may then be made. The CPU 20 may conveniently be programmed to monitor the impedance measurements to raise an alarm via the telecommunications link 21 if any significant changes in impedance occur, such as changes of the impedance of a single cell that exceed a preset threshold, or the impedance of a single cell differing from the battery average by more than a preset threshold.

The apparatus shown may be used to measure the impedance of cells of the battery. By monitoring how the measurement of impedance of individual cells or groups of cells changes over time, the skilled person is able to obtain an indication of the conditions of individual cells, for example on observing an increase in the impedance of a single cell that is characteristic of a fault in or problem with that cell.

Similar apparatus may be used to monitor other parameters of individual cells or groups of cells. The power dissipated by a cell within a given frequency band, or the resistive, capacitative or inductive components of the impedance may, for example, be useful for obtaining an indication of the conditions of individual cells, and may be monitored using variations to the described apparatus that will be familiar to the person skilled in the art.

FIG. 3 shows, schematically an apparatus for measuring the voltage across cells or groups of cells within the battery of an uninterruptable power supply. The diagram illustrates a particular configuration of apparatus that may be used to implement the voltage measurement function of the apparatus shown in FIG. 2. Accordingly, features common to FIGS. 2 and 3 are labelled with like reference numerals.

The battery 30 comprises a number of cells or groups of cells 11. Electrical connections from the junctions between each cell or group of cells 11 to a voltage measuring apparatus are made through current limiting protection resistors 31 and through pickup wires 32.

The current limiting protection resistors 31 protect the voltage measuring apparatus from current surges and electrical damage.

The pickup wires 32 connect the current limiting protection resistors 31 to an array of divider resistor networks 33 configured to scale the voltages being measured to a level appropriate for the electronic circuits that follow.

A multiplexer array 15 samples each pair of adjacent voltage measurements in turn. The pair of voltage outputs from the multiplexer array 15 passes through buffers 35 and to a differentiator 36 which removes the d.c. component of the signal. The resultant pair of voltage outputs is then passed to a subtractor 37 which converts the differential voltage input signal to a single bipolar output signal. The single voltage output from the subtractor 37 is then filtered by a clock sweepable fifth order band pass filter 16. The central frequency of the band pass filter is controlled by a programmable clock 39. A central frequency for the filter may be chosen to best indicate battery condition as described above.

The filtered signal is passed through a root-mean-square (r.m.s.) to d.c converter 17 to convert the filtered alternating signal to a d.c. voltage which is sampled by an analogue to digital converter 18. A digital output 42 from the analogue-to-digital converter may be passed to a central processing unit as described in connection with FIG. 2.

An equivalent apparatus may be provided for measuring the current passing through the battery, employing a similar filter, root mean square to d.c. converter and analogue to digital converter. Alternatively, an ammeter or other circuitry may be provided between the battery 30 and the multiplexer array 15 to enable the apparatus to sample the ripple current as well. In either case, the digital output that represents the measured current is passed to the central processing unit for the purposes of calculating the impedance of each cell or group of cells.

Typically, batteries for uninterruptable power supplies comprise multiple cells grouped into units. It will be understood that the apparatus described herein is equally suitable for measuring individual cells, groups of cells or indeed the whole battery, as desirable. It will also be appreciated that the specific implementation of the various features shown in FIG. 3 is a matter of design choice. For example, discrete analogue or digital components might be used, or integrated circuits as appropriate. Alternatively, software filtering and software calculation of the root-mean-square to d.c. function could be employed. Likewise, common components may be used to process both the voltage and current components, or separate circuits could be used.

If only a very small amount of ripple current flows through the battery of an uninterruptable power supply system, and this current is insufficient for the effective operation of the impedance measurement equipment, then a signal generator may be provided to inject current into the system during times of impedance measurement.

What is claimed is:

1. A method of measuring the electrical efficacy of a plurality of groups of one or more battery cells while in use in an uninterruptable power supply, the method comprising:

measuring, using simultaneous electrical connections across each group of cells, an a.c. component of a voltage across each group of cells, the a.c. component arising from a ripple current in said plurality of groups of one or more cells while in use; and determining the electrical efficacy of each group of cells on the basis of the measured a.c. voltage components.

2. The method of claim 1, in which the step of determining the electrical efficacy of each group of cells includes obtaining numerical values from the measured a.c. voltage components.

3. The method of claim 2, in which the electrical efficacy of one of the groups of battery cells is determined by comparison of the associated numerical value with a corresponding further numerical value obtained by measurement of an a.c. voltage components from another of the other groups of cells.

4. The method of claim 3, in which the electrical efficacy of one of the groups of battery cells is determined by comparison of the associated numerical value with the average of a plurality of further numerical values obtained by measurements of the a.c. voltage components from a corresponding plurality of the other groups of cells.

5. The method of claim 2, in which the electrical efficacy of each group of battery cells is determined by comparison of each associated numerical value with a corresponding predetermined numerical value.

6. The method of claim 1, further comprising the steps of measuring both an a.c. component of current through the plurality of groups of battery cells and the a.c. component of the voltage across each said group of battery cells; and obtaining a value for the internal impedance of each group of battery cells via a combination of said current component and said voltage component.

7. The method of claim 1, in which the step of measuring includes the steps of:

measuring electrical signals representative of one of the voltage level across each group of cells and the current level through the plurality of groups of cells; and frequency filtering the each-measured electrical signal to extract the measured a.c. component arising from the ripple current.

8. The method of claim 7, in which the steps of filtering includes isolating a band of frequencies from each measured electrical signals.

9. The method of claim 7, in which the step of filtering includes isolating a band of frequencies including those frequencies which include at least one harmonic frequency of an a.c. main frequency.

10. The method of claim 9, including isolating a band of frequencies around 900 Hz.

11. The method of claim 9, including isolating a band of frequencies around 1080 Hz.

12. An apparatus for measuring the electrical efficacy of a plurality of groups of one or more battery cells while in use in an uninterruptable power supply, the apparatus comprising:

simultaneous electrical connections across each group of cells;

voltage measuring means connected to said simultaneous electrical connections and arranged to thereby measure an a.c. component of a voltage across each group of cells, the a.c. voltage component arising from a ripple current in said plurality of groups of one or more battery cells while in use, the electrical efficacy of each group of cells being determined on the basis of the measured a.c. voltage components.

13. An apparatus as claimed in claim 12, further comprising an ammeter arranged to measure an a.c. component of a current flowing through the battery cell or cells, the a.c. current component also arising from said ripple current in said plurality of groups of one or more battery cells while in use, the electrical efficacy of each group of cells being determined on the basis of both the measured a.c. voltage components and the a.c. current component.

14. An apparatus as claimed in claim 13, in which the electrical efficacy is determined on the basis of impedances calculated from the ratio of said measured a.c. voltage components to said measured a.c. current component.

15. An apparatus as claimed in claim 12, further comprising a frequency filter arranged to pass a band of frequencies including the frequency of the a.c. component arising from the ripple current.

16. An apparatus as claimed in claim 15 in which the filter is a fifth order band pass filter.

17. An apparatus as claimed in claim 16, in which the filter is arranged to pass a band of frequencies including at least one harmonic frequency of an a.c. main frequency.

18. An apparatus as claimed in claim 17, in which the filter is arranged to pass a band of frequencies including 900 Hz.

19. An apparatus as claimed in claim 17, in which the filter is arranged to pass a band of frequencies including 1080 Hz.

* * * * *

UNITED STATES PATENT AND TRADEMARK OFFICE
CERTIFICATE OF CORRECTION

PATENT NO. : 6,765,388 B1 Page 1 of 1
APPLICATION NO. : 10/049746
DATED : July 20, 2004
INVENTOR(S) : Andrew Simon Clegg It is certified that error appears in the above-identified patent and that said Letters Patent is hereby corrected as shown below:

Column 7,
Line 28, change "components" to -- component --.

Column 8,
Line 35, change ";" to -- , --.

Signed and Sealed this

Twenty-seventh Day of June, 2006

JON W. DUDAS
*Director of the United States Patent and Trademark Office*